US 6,838,325 B2

(12) United States Patent
Whelan et al.

(10) Patent No.: US 6,838,325 B2
(45) Date of Patent: Jan. 4, 2005

(54) METHOD OF FORMING A SELF-ALIGNED, SELECTIVELY ETCHED, DOUBLE RECESS HIGH ELECTRON MOBILITY TRANSISTOR

(75) Inventors: Colin S. Whelan, Wakefield, MA (US); Elsa K. Tong, Wayland, MA (US)

(73) Assignee: Raytheon Company, Waltham, MA (US)

( * ) Notice: Subject to any disclaimer, the term of this patent is extended or adjusted under 35 U.S.C. 154(b) by 39 days.

(21) Appl. No.: 10/279,358

(22) Filed: Oct. 24, 2002

(65) Prior Publication Data
US 2004/0082158 A1 Apr. 29, 2004

(51) Int. Cl.⁷ .......................................... H01L 21/8252
(52) U.S. Cl. ........................ 438/172; 438/174; 438/571; 438/704
(58) Field of Search ................................ 438/171–176, 438/576–582, 704, 695, 167, 172, 173, 187, 677

(56) References Cited

U.S. PATENT DOCUMENTS

| | | | | |
|---|---|---|---|---|
| 4,616,400 A | * | 10/1986 | Macksey et al. | 438/577 |
| 4,839,310 A | * | 6/1989 | Hollis et al. | 438/173 |

(List continued on next page.)

FOREIGN PATENT DOCUMENTS

| | | |
|---|---|---|
| DE | 198 27 901 A1 | 1/1999 |
| EP | 0 855 748 A | 7/1998 |
| JP | 09 045894 | 6/1997 |

OTHER PUBLICATIONS

Copy of International Search Report for PCT/US03/32687 dated Mar. 11, 2004.
K. Alavi, et al., "A Very High Performance, High Yield, and High Throughput Millimeter Wave Power pHEMT Process Technology", CaAs Mantech Conference, May 21–24, 2001 pp. 105–107.
Ronald Grundbacher, et al., "Utilization of an Electron Beam Resist Process to Examine the Effects of Asymmetric Gate Recess on the Device Characteristics of AlGaAs/InGaAs PHEMT's", IEEE Transactions on Electron Devices, vol. 44, No. 12, Dec. 1997, pp. 2136–2142.

Primary Examiner—Michael Lebentritt
(74) Attorney, Agent, or Firm—Daly, Crowley & Mofford, LLP

(57) ABSTRACT

A method is provided for forming a self-aligned, selectively etched, double recess high electron mobility transistor. The method includes providing a semiconductor structure having a III–V substrate; a first relatively wide band gap layer, a channel layer, a second relatively wide band gap Schottky layer, an etch stop layer; a III–V third wide band gap layer on etch stop layer; and an ohmic contact layer on the third relatively wide band gap layer. A mask is provided having a gate contact aperture to expose a gate region of the ohmic contact layer. A first wet chemical etch is brought into contact with portions of the ohmic contact layer exposed by the gate contact aperture. The first wet chemical selectively removes exposed portions of the ohmic contact layer and underlying portions of the third relatively wide band gap layer. The etch stop layer inhibits the first wet chemical etch from removing portions of such etch stop layer. Next, a second wet chemical etch is brought into contact with structure etched by the first wet chemical etch. The second wet chemical etch selectively removes exposed portions of the ohmic contact layer while leaving substantially un-etched exposed portions of the third relatively wide band gap layer, the Schottky contact layer and the etch stop layer. The etch stop layer is removed. A metal layer is deposited over the mask and through gate aperture therein onto, and in Schottky contact with, the Schottky contact layer.

20 Claims, 3 Drawing Sheets

U.S. PATENT DOCUMENTS

| | | | | |
|---|---|---|---|---|
| 4,908,325 A | * | 3/1990 | Berenz | 438/172 |
| 5,021,857 A | * | 6/1991 | Suehiro | 257/392 |
| 5,140,386 A | * | 8/1992 | Huang et al. | 257/194 |
| 5,270,228 A | | 12/1993 | Ishikawa | 437/39 |
| 5,364,816 A | * | 11/1994 | Boos et al. | 438/172 |
| 5,504,353 A | | 4/1996 | Kuzuhara | |
| 5,556,797 A | | 9/1996 | Chi et al. | 437/405 |
| 5,654,214 A | * | 8/1997 | Frijlink et al. | 438/172 |
| 6,060,402 A | * | 5/2000 | Hanson | 438/745 |
| 6,180,968 B1 | | 1/2001 | Kasahara et al. | |
| 6,194,747 B1 | | 2/2001 | Onda | 257/192 |
| 6,242,293 B1 | | 6/2001 | Danzilio | |
| 6,258,639 B1 | * | 7/2001 | Rohdin et al. | 438/167 |
| 6,524,899 B1 | * | 2/2003 | Grundbacher et al. | 438/167 |
| 6,586,113 B1 | * | 7/2003 | Bahl et al. | 428/620 |
| 6,620,662 B2 | * | 9/2003 | Hoke et al. | 438/172 |
| 6,627,473 B1 | * | 9/2003 | Oikawa et al. | 438/46 |

\* cited by examiner

METHOD OF FORMING A SELF-ALIGNED, SELECTIVELY ETCHED, DOUBLE RECESS HIGH ELECTRON MOBILITY TRANSISTOR

TECHNICAL FIELD

This invention relates to high electron mobility transistors (HEMTs) and more particularly to self-aligned, double recess gate HEMTs.

BACKGROUND

As is known in the art, there are several types of active devices used at microwave and millimeter frequencies to provide amplification of radio frequency signals. In general, one of the more common semiconductor devices used at these frequencies is the high electron mobility transistor (HEMT). Typically, HEMTs are formed from Group III–V materials such as gallium arsenide (GaAs) or indium phosphide (InP). In a HEMT there is a doped donor/undoped spacer layer of one material and an undoped channel layer of a different material. A heterojunction is formed between the doped donor/undoped spacer layer and the undoped channel layer. Due to the conduction band discontinuity at the heterojunction, electrons are injected from the doped donor/undoped spacer layer into the undoped channel layer. Thus, electrons from the large bandgap donor layer are transferred into the narrow bandgap channel layer where they are confined to move only in a plane parallel to the heterojunction. Consequently, there is spatial separation between the donor atoms in the donor layer and the electrons in the channel layer resulting in low impurity scattering and good electron mobility.

One device which has been found to provide good device characteristics such as breakdown voltage, output currents, and pinch-off voltage is a double recessed HEMT. Such a device is fabricated with two aligned recesses in which the gate is formed. The recesses are typically formed by wet etching the device. The etching process is periodically interrupted and the device is tested for certain characteristics, e.g., current. If the characteristics meet the desired criteria, then etching for that recess is terminated. Otherwise, the etching continues. This process continues until both recesses meet the established criteria. This process takes time and money to repeatedly stop the etching and test the device. Also, the etching is not uniform across the wafer, resulting in inconsistent device characteristics across the wafer and low yield of acceptable devices on the wafer.

Presently, there are other major problems impeding the fabrication of double recess High Electron Mobility Transistors (HEMTs). As the technology moves towards smaller dimensions for improved performance, the ability to place a 0.15 micron gate recess pattern within a 0.6 micron first recess pattern is becoming extremely difficult, if not impossible, due to the alignment capability certain electron beam lithography tools. If a tool has an alignment accuracy of 0.15 micrometers, then the overlay accuracy of two layers (first recess pattern and gate pattern) on top of one another is square root of $(0.15^2+0.15^2)=0.21$ micrometers. Another e-beam lithography system has a better overlay accuracy of square root of $(0.1^2+0.1^2)=0.14$ micrometers. These misalignments of a 0.15 micrometer gate recess pattern within the 0.6 micrometer first recess, often result in placement of the edge of the gate within 0.015–0.085 micrometer of the highly doped cap layer defined by the first recess. This results in very low device and circuit yields due to shorting.

One solution would be to use extremely expensive optical steppers, which could place the gate pattern with a maximum misalignment of 0.04 microns. Secondly, the cost of 2 separate electron-beam writes (first recess and gate) results in a costly product, since these are the most expensive and time consuming steps of the entire process. Finally, the current gate etch technology is non-selective. The devices are gate etched and re-etched repeatedly until a desired current is met, resulting in non-uniformities across the wafer.

A single-beam write process is described in an article by Grundbacher et al, published in IEEE Electron Devices, Vol. 44, No. 12, December 1997, pg. 2136–2142. This process provides two recesses with a single-beam write. However, the process uses a four-layer polymethylmethacrylate (PMMA) resist process with electron-beam written with two patterns on top of each other (i.e., the first recess and gate). The process would be very difficult to reproduce across a four-inch wafer and would require a relatively long writing time in order to pattern the wide first recess dimension. First the process requires a high density, low bias etcher (ECR, TCP, ICP) to minimize the damage to the Schottky layer by the accelerated ions used in the etching process. Secondly, the process has the disadvantage in that there must be concern of the erosion of the thin layers of PMMA used in their resist structure from ion bombardment. Finally, liftoff of the PMMA (and therefore the gate metal on the resist) is relatively difficult after it has been hardened in the high temperature plasma.

Other processes are described in U.S. Pat. Nos. 4,616,400, 5,364,816, and 5,556,797 all of which describe processes where a single or multiples layers of resist are patterned a first wet or dry chemical etch is used. The resist layer(s) is then "pulled back" via non-directional plasma etching or redeveloping of the resist to increase it's original dimension. A second etch is then required.

SUMMARY

In accordance with the present invention, a method is provided for forming a double recess high electron mobility transistor. The method includes providing a semiconductor structure having a III–V substrate; a first relatively wide band gap layer over the substrate; a relatively small band gap channel layer deposited on the relatively wide band gap layer; a second relatively wide band gap Schottky layer over the channel layer; an etch stop layer over the Schottky layer; a third relatively wide band gap layer disposed on the etch stop layer; and a doped ohmic contact layer disposed over the third relatively wide band gap layer. A mask is provided having a gate contact aperture to expose a gate region of the contact layer. A first wet chemical etch is brought into contact with portions of the contact layer exposed by the gate contact aperture. The first wet chemical selectively removes exposed portions of the contact layer and underlying portions of the third relatively wide band gap layer. The etch stop layer inhibits the first wet chemical etch from removing portions of such etch stop layer. Next, a second wet chemical etch is brought into contact with structure etched by the first wet chemical etch. The second wet chemical etch selectively removes exposed portions of the contact layer while leaving substantially un-etched exposed portions of the third relatively wide band gap layer, and the etch stop layer. A third wet chemical selectively removes the etch stop layer while leaving un-etched the donor layer and ohmic contact layer. Metal is deposited over the mask and through gate aperture therein onto, and in Schottky contact with, the Schottky layer.

In one embodiment, the etch stop layer comprises AlAs.

In one embodiment, the channel layer comprises $In_xGa_{1-x}As$ (0<X<25%), or $In_xGaAs$ (30<x<70%).

In one embodiment, the third relatively wide band gap layer comprises AlGaAs, InAlGaAs, or AlAs.

In one embodiment, the Schottky contact layer comprises InAlAs, AlGaAs or InAlGaAs.

In one embodiment, the ohmic contact layer comprises doped InGaAs or GaAs.

In one embodiment, the first wet chemical etch is substantially 2.5 pH citric acid: $H_2O_2$.

In one embodiment, the first wet chemical etch is substantially 4.2 pH succinic acid: $H_2O_2$.

In one embodiment, the second wet chemical etch is substantially 5.3 pH Succinic acid: $H_2O_2$.

In one embodiment, the second wet chemical etch is substantially 6.4 pH citric acid: $H_2O_2$.

By selectively etching both the gate and first recess pattern, non-uniformities are greatly diminished. Both the first recess and gate recess etches are performed using only one electron-beam pattern, such pattern being used to form the mask, thereby significantly reducing the cost and manufacturing time of the product. Finally, since both etches are performed using a single resist pattern provided in the mask, the gate recess is perfectly aligned (i.e., self-aligned) within the center of the first recess.

The details of one or more embodiments of the invention are set forth in the accompanying drawings and the description below. Other features, objects, and advantages of the invention will be apparent from the description and drawings, and from the claims.

DETAILED DESCRIPTION

Figure 1A:
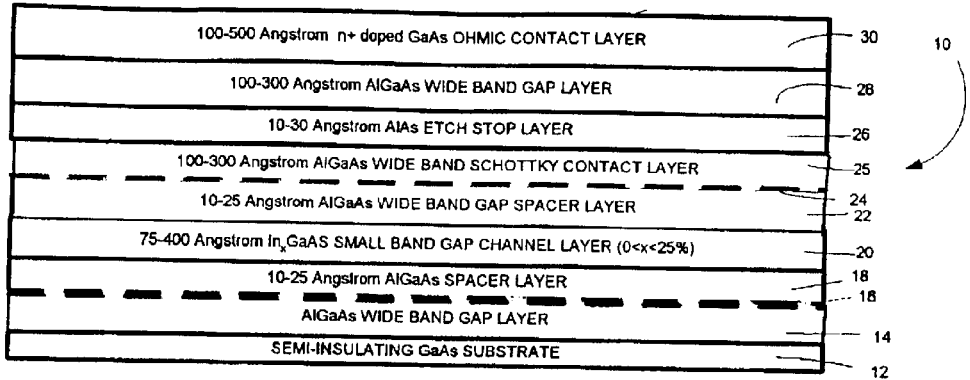
FIGS. 1A–1F are cross sectional drawings of a self-aligned, double recess gate GaAs pseudomorphic HEMT at various stages in the fabrication thereof; and Like reference symbols in the various drawings indicate like elements.

Referring now to FIG. 1A, a semiconductor structure 10 is shown having a bottom, III–V, substrate, 12, here gallium arsenide. A first relatively wide band gap layer 14, here AlGaAs is on the substrate 12. Here, an ultra thin silicon doped (pulse) layer 16 is formed in layer 14. A 10–25 Angstrom thick AlGaAs spacer layer 18 is on layer 16. A 75–400 Angstrom thick $In_xGaAs$ (0<x<25%) relatively small band gap channel layer 20 is on the layer 18. A 10–25 Angstrom thick AlGaAs spacer layer 22 is on the layer 20. Here, an ultra thin silicon doped (pulse) layer 24 is formed in layer 22. A 100–300 Angstrom thick AlGaAs relatively wide band gap Schottky layer 25 is on the layer 24. A 10–30 Angstrom thick AlAs etch stop layer 26 is on layer 25. A 100–500 Angstrom thick layer relatively wide band gap layer 28 of AlGaAs is on the etch stop layer 26. A 100–500 Angstrom thick, n+ doped, (here $10^{17}$ to $8\times10^{19}$ per $cm^3$) GaAs ohmic contact layer 30 is on layer 28. A heterojunction is formed between the wide band gap Schottky layer 25 and the small band gap undoped channel layer 20. Due to the conduction band discontinuity at the heterojunction, electrons are injected from the Schottky/undoped spacer layer 25/22 into the undoped channel layer 20.

Figure 1B:
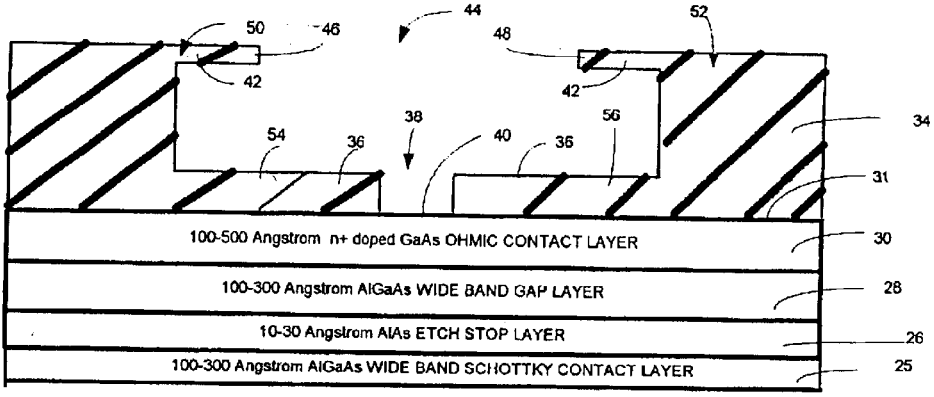

Next, referring to FIG. 1B, the surface of layer 33 (FIG. 1A) is coated with a sacrificial masking layer 34, here a three-layer PMMA resist or multiple optical resist layers. The photoresist layer 34 has a lower portion 36 with the gate contact aperture 38 to expose a gate region 40 of the ohmic contact layer 30. An upper portion 42 of layer 34 is vertically spaced from the lower portion 36 and has a gate electrode metalization aperture 44. Edges 46, 48, of the gate electrode metalization aperture 44 terminate in overhangs 50, 52 which expose the gate contact aperture 38 and surface portions 54, 56 of the lower portion 36 of the photoresist layer 34 adjacent to the gate contact aperture 38 for a metal liftoff profile. The gate contact aperture 38 is here smaller than the gate electrode metalization aperture 44, so that a large, low resistance, metal layer can be added to the small, higher resistance, metal gate stem to be formed.

The shaped of layer 34 is formed in one of two ways: (1) When the three layer PMMA resist is used (i.e., a tri-level e-beam resist), such is exposed and developed to produce the shape shown in FIG. 1B; or (2) when multiple optical resists is used, a thin single layer e-beam resist, followed by coating, exposing and developing an optical resist on top. Exposure of layer is peformed using electron-beam lithography or optical lithography tool. Development of exposed resist to form ~0.15 micrometer gate contact aperture 38. See for example: K. Alavi, D. Shaw, A. Platzker, B. Rizzi, S. Ogut, and R. Puente, "A very high performance, high yield, and high throughput millimeter wave power pHEMT process technology," published in GaAs MANTECH Technical Digest, May 2001, pp. 105–107.

After forming the layer 34 as shown in FIG. 1B, a selective wet chemical gate etch is applied to the surface of the structure shown in FIG. 1B. Here, the wet chemical etch is 2.5 pH Citric Acid :$H_2O_2$ (98:2) or alternatively 4.2 pH Succinic Acid: $H_2O_2$ (15:1). The etch isotropically removes exposed portions of layers 32 and 28 and continues down to the AlAs etch stop layer 26. The resulting structure is shown in FIG. 1C.

Figure 1C:
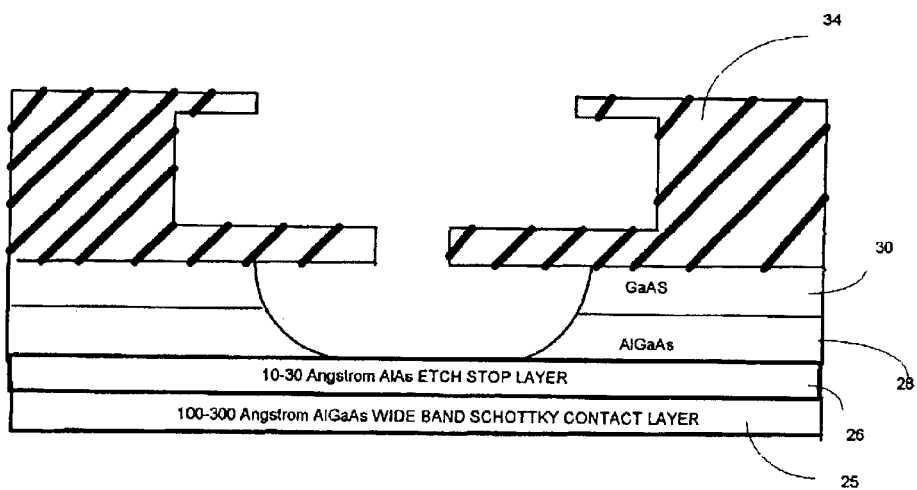
Figure 1D:
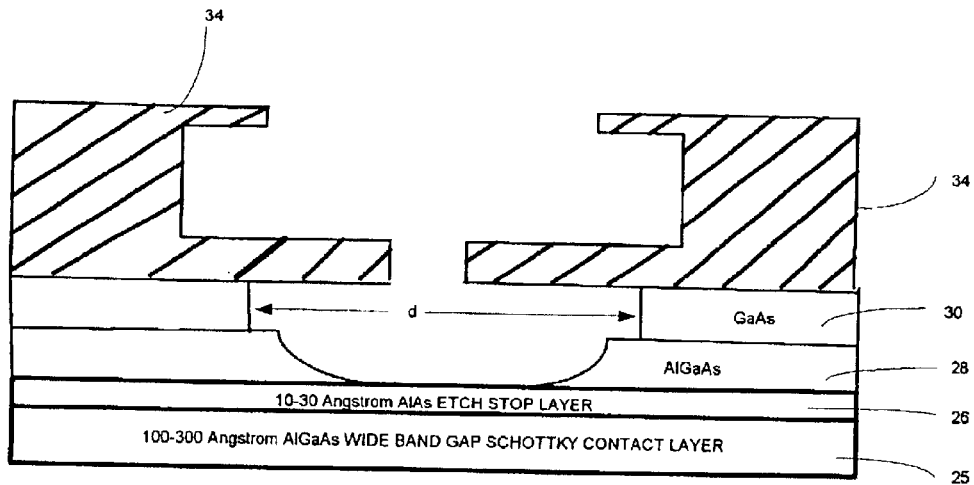
Figure 1E:
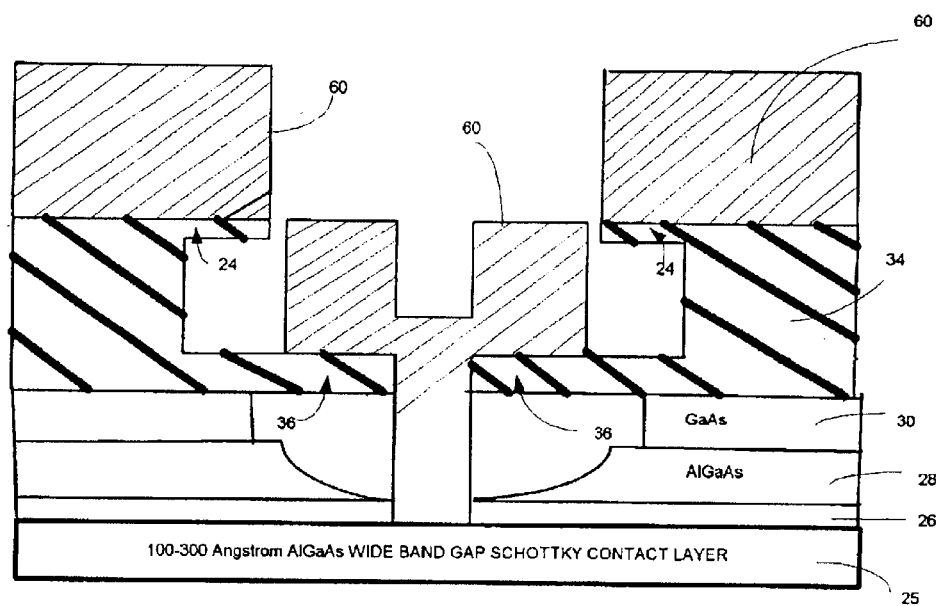

Next, a second selective wet chemical gate etch is applied to the surface of the structure shown in FIG. 1C. Here, the second wet gate etch is 5.3 pH Succinic Acid (SA): $H_2O_2$ (6:1) or 6.4 pH citric acid: $H_2O_2$. This second etch only removes exposed portions of the GaAs layer 30 without etching AlGaAs layer 28 or AlAs layer 26. This is etched until the proper (~0.4–1.0 micrometer) dimension, d, is achieved, as shown in FIG. 1D. Finally, dilute (5%) $NH_4OH$ or HCl is used to remove exposed portions of the AlAs etch stop layer 26, such wet etch leaving substantially un-etched layers 28 and 30 as shown in FIG. 1E.

Next, a blanket of metal, here thin Ti/Pt and then thick gold, is deposited, here evaporated, uniformly over the surface of the sacrificial layer 34 to form metal layer 60. It is noted that because of the vertical spacing between the lower and upper portions 36, 42 portions of the metal 60 on lower surface portions 36 of the sacrificial layer 34 are separated from the portions of the metal 60 on the upper portions 42 of the sacrificial layer 34, as shown in FIG. 1E.

Figure 1F:
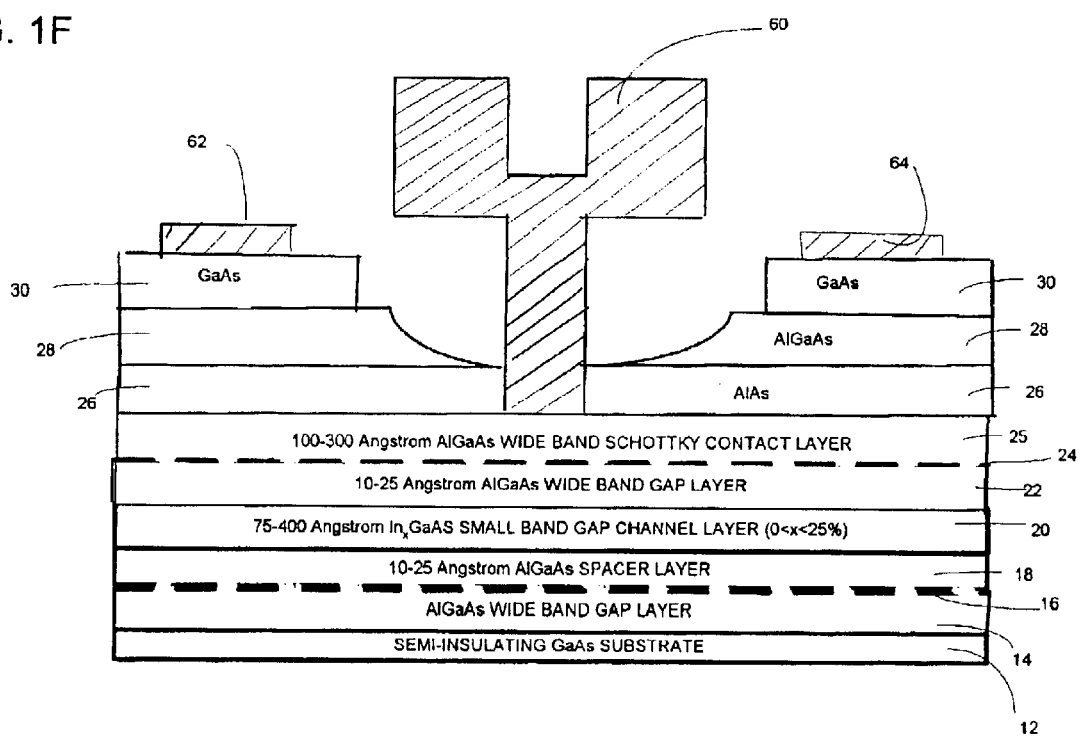

After the metal deposition, the PMMA or strip of conventional optical resist providing sacrificial layer 34 is lifted off, along with portion of the metal 60 thereon, leaving a double selectively etched, self-aligned double recess using only one resist pattern, as shown in FIG. 1F. Thus, the remaining metal 60 shown in FIG. IF provides a gate electrode in Schottky contact with the Schottky contact layer 26. Source and drain electrodes 62, 64 are formed in ohmic contact with layers 32 before or after the selective recess process, to complete the device pHEMT device.

It is to be noted that the identical process can be applied, with the exception of using only succinic acid, to another layer structure. For example, formation of a metamorphic high electron mobility transistor (MHEMT) layer structure or an InP HEMT. Thus, here the starting structure is a semiconductor structure having a bottom, III–V substrate, of GaAs for a metamorphic HEMT or InP for an InP HEMT. A wide band gap layer of InAlAs or InAlGaAs is then grown. A small band gap channel layer, here 150-Angstrom thick $In_xGaAs$ (30<x<70%) is disposed over and spaced from, the wide band gap layer. A 10–30 Angstrom InAlAs or InAlGaAs spacer layer is disposed over, and spaced from, the channel layer. A silicon pulse doping is disposed over such spacer layer. A 100–300 Angstrom thick InAlAs or InAlGaAs wide band gap Schottky contact layer is disposed over, and spaced from, the Si pulse layer. Then a 10–30-Angstrom thick layer III–V etch stop layer of AlAs is disposed on the Schottky contact layer. A 100–300 Angstrom InAlAs or InAlGaAs wide band gap layer is disposed on the etch stop layer. A 50–500 Angstrom thick n+ doped $In_xGaAs$ ohmic contact layer is disposed on layer.

Again, the surface of the ohmic contact layer is coated with a sacrificial masking layer as layer 34 in FIG. 1B.

After forming the sacrificial masking layer, a selective wet chemical gate etch is applied to the surface of the structure. Here, the wet chemical etch is 4.2 pH Succinic acid:$H_2O_2$ (15:1). The etch isotropically removes exposed portions of the $In_xGaAs$ ohmic contact layer and the InAlAs or InAlGaAs layer and continues down to, but stops at, the AlAs etch stop layer.

Next, a second selective wet chemical gate etch is applied to the surface of the structure. Here, the second wet gate etch is 5.3 pH Succinic Acid (SA): $H_2O_2$ (6:1). This second etch only removes exposed portions of the $In_xGaAs$ ohmic contact layer without etching the InAlAs or InAlGaAs donor layer or the etch stop layer. This is etched until the proper (~-0.4–1.0 micrometer) dimension, d, is achieved, as shown in FIG. 2D. Finally, the stop layer is removed with dilute $NH_4OH$ or HCl.

Next, a blanket of metal is deposited, here evaporated, uniformly over the surface of the sacrificial layer as shown in FIG. 1E. After the metal deposition, the PMMA or strip of conventional optical resist providing sacrificial layer is lifted off, along with portion of the metal thereon, leaving a double selectively etched, self-aligned double recess using only one resist pattern. Thus, the remaining metal provides a gate electrode in Schottky contact with the InAlAs or InAlGaAs Schottky layer.

A number of embodiments of the invention have been described. Nevertheless, it will be understood that various modifications may be made without departing from the spirit and scope of the invention. Accordingly, other embodiments are within the scope of the following claims.

What is claimed is:

1. A method for forming a double recess high electron mobility transistor, comprising:
   providing a semiconductor structure having a III–V substrate; a wide band gap layer; a small band gap channel layer; a wideband gap Schotitky contact layer; an etch stop layer; a first wide band gap layer; and a ohmic contact layer;
   providing a mask, such mask having a second gate contact aperture to expose a gate region of the ohmic contact layer;
   bringing a first wet chemical etch into contact with portions of the ohmic contact layer exposed by the gate contact aperture, such etch selectively removing exposed portions of the ohmic contact layer and underlying portions of the second wide band gap layer, such etch stop layer inhibiting such etch from removing portions of such etch stop layer;
   bringing a second wet chemical etch into contact with said structure etched by the first wet etch, such second etch selectively removing exposed portions of the ohmic contact layer while leaving substantially un-etched exposed portions of the second wide band gap and the etch stop layer; and
   removing the etch stop layer;
   depositing a metal layer over the mask and through gate aperture therein onto, and in Schottky contact with the Schottky contact layer.

2. The method recited in claim 1 wherein the etch stop layer comprises an AlAs.

3. The method recited in claim 2 wherein the channel layer comprises InGaAs.

4. The method recited in claim 3 wherein the second wide band gap layer comprises AlGaAs, InAlAs or InAlGaAs.

5. The method recited in claim 2 wherein the Schottky contact layer comprises InAlAs, InAlGaAs or AlGaAs.

6. The method recited in claim 5 wherein the ohmic contact layer is InGaAs or GaAs.

7. The method recited in claim 5 wherein the first wet chemical etch is substantially 2.5pH acid:$H_2O_2$ or 4.2 pH succinic acid: $H_2O_2$.

8. The method recited in claim 5 wherein the second wet chemical etch is substantially 5.3 pH Succinic acid: $H_2O_2$ or 6.4 pH citric acid: $H_2O_2$.

9. A method for forming a double recess high electron mobility transistor, comprising:
   providing a semiconductor structure having a III–V substrate; a first relatively wide band gap layer; a relatively small band gap channel layer, a second relatively wide band gap layer, an etch stop layer over the substrate; a III–V Schottky contact layer on etch stop layer; a third relatively wide band gap layer on the etch stop layer; and an ohmic contact layer on the third relatively wide band gap layer;
   providing a mask on over the ohmic contact layer, such mask having a lower portion with said a gate contact aperture exposing a gate region of the channel layer; an upper portion vertically spaced from the lower portion and having a gate electrode metalization aperture; edges of the gate electrode metalization aperture terminating in overhangs which expose the gate contact aperture; surface portions of the lower portion of the mask being disposed adjacent to the gate contact aperture;
   bringing a first wet chemical etch into contact with portions of the ohmic contact layer exposed by the gate contact aperture, such etch selectively removing exposed portions of the ohmic contact layer and underlying portions of the third relatively wide band gap layer, such etch stop layer inhibiting such etch from removing portions of such etch stop layer;
   bringing a second wet chemical etch into contact with structure etched by the first wet etch, such second etch selectively removing exposed portions of the ohmic contact layer while leaving substantially un-etched exposed portions of the third wide band gap layer and the etch stop layer;
   removing the etch stop layer;
   depositing a metal layer over the mask, such metal being deposited on the upper portion thereof, through the gate electrode metalization aperture, through the gate contact aperture, and through gate aperture onto, and in Schottky contact with, the Schottky contact layer; and lifting portions mask to remove portions of the metal disposed onto the upper surface of the mask while leaving portions of the deposited metal to provide a gate electrode for the transistor.

10. The method recited in claim 9 wherein the etch stop layer comprises AlAs.

11. The method recited in claim 10 wherein the channel layer comprises InGaAs.

12. The method recited in claim 11 wherein the third wide band gap layer comprises AlGaAs, InAlGaAs, InAlAs.

13. The method recited in claim 10 wherein the channel layer Schottky contact layer comprises InAlGaAs, InAlAs or AlGaAs.

14. The method recited in claim 13 wherein the ohmic contact layer comprises InGaAs or GaAs.

15. The method recited in claim 14 wherein the first wet chemical etch is substantially 2.5pH citric acid: $H_2O_2$.

16. The method recited in claim 14 wherein the second wet chemical etch is substantially 5.3 pH Succinic acid: $H_2O_2$.

17. The method recited in claim 13 wherein the first wet chemical etch is substantially 4.2 pH succinic acid: $H_2O_2$.

18. The method recited in claim 17 wherein the second wet chemical etch is substantially 6.4 pH citric acid: $H_2O_2$.

19. The method recited in claim 15 wherein the first wet chemical etch is substantially 4.2 pH succinic acid: $H_2O_2$.

20. The method recited in claim 19 wherein the second wet chemical etch is substantially 6.4 pH citric acid: $H_2O_2$.

* * * * *

UNITED STATES PATENT AND TRADEMARK OFFICE
CERTIFICATE OF CORRECTION

PATENT NO. : 6,838,325 B2
DATED : January 4, 2005
INVENTOR(S) : Colin S. Whelan et al.

It is certified that error appears in the above-identified patent and that said Letters Patent is hereby corrected as shown below:

Column 2,
Line 31, delete "5,556,797 all" and replace with -- 5,556,797, all --.
Line 35, delete "it's" and replace with -- its --.

Column 4,
Line 18, delete "When" and replace with -- when --.
Line 21, delete "is used," and replace with -- are used --.
Line 24, delete "tool." and replace with -- tools. --.
Line 34, delete "Acid :H202" and replace with -- Acid; $H_2O_2$ --.
Line 67, delete "device PHEMT device." and replace with -- PHEMT device. --.

Column 5,
Line 16, delete 10-30-Angstrom" and replace with -- 10-30 Angstrom --.
Line 44, delete "portion" and replace with -- portions --.
Line 59, delete "Schotitky" and replace with -- Schottky --.

Signed and Sealed this

Twenty-sixth Day of April, 2005

JON W. DUDAS
*Director of the United States Patent and Trademark Office*